US011277146B2

(12) United States Patent
Lindholm et al.

(10) Patent No.: US 11,277,146 B2
(45) Date of Patent: Mar. 15, 2022

(54) ANALOG-TO-DIGITAL CONVERTER

(71) Applicant: Intel Corporation, Santa Clara, CA (US)

(72) Inventors: Christian Lindholm, Villach (AT); Hundo Shin, Santa Clara, CA (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/912,733

(22) Filed: Jun. 26, 2020

(65) Prior Publication Data

US 2021/0409035 A1 Dec. 30, 2021

(51) Int. Cl.
| | |
|---|---|
| *H03M 1/34* | (2006.01) |
| *H03M 1/68* | (2006.01) |
| *H03M 1/38* | (2006.01) |
| *H03M 1/12* | (2006.01) |
| *H03M 1/00* | (2006.01) |
| *H03M 1/10* | (2006.01) |
| *H03M 1/06* | (2006.01) |

(52) U.S. Cl.
CPC .............. *H03M 1/68* (2013.01); *H03M 1/38* (2013.01); *H03M 1/00* (2013.01); *H03M 1/06* (2013.01); *H03M 1/10* (2013.01); *H03M 1/12* (2013.01)

(58) Field of Classification Search
CPC ............ H03M 1/00; H03M 1/12; H03M 1/10; H03M 1/06; H03M 1/68; H03M 1/38
USPC .................................. 341/163, 155, 118, 120
See application file for complete search history.

(56) References Cited

U.S. PATENT DOCUMENTS 10,855,302 B2 * 12/2020 Ali ..................... H03M 1/1215
2016/0182075 A1 * 6/2016 Devarajan ............ H03M 1/128
341/120

OTHER PUBLICATIONS

Wenning Jiang et al., "A 7.6mV 1GS/s 60dB SNDR Single-Channel SAR-Assisted Pipelined ADC with Temperature-Compensated Dynamic Gm-R-Based Amplifier", IEEE International Solid-State Circuits Conference, pp. 60-62, 2019.
Lukas Kull et al., "A 10b 1.5GS/s Pipelined-SAR ADC with Background Second-Stage Common-Mode Regulation and Offset Calibration in 14nm CMOS FinFET", IEEE International Solid-State Circuits Conference, pp. 474-476, Feb. 8, 2017.

(Continued)

*Primary Examiner* — Joseph J Lauture
(74) *Attorney, Agent, or Firm* — 2SPL Patent Attorneys PartG mbB; Yong Beom Hwang

(57) ABSTRACT

An analog-to-digital converter (ADC) configured to convert an analog signal to digital bits. The ADC includes a plurality of sub-ADCs that are cascaded in a pipeline. Each sub-ADC may be configured to sample an input signal that is fed to each sub-ADC and convert the sampled input signal to a pre-configured number of digital bits. Each sub-ADC except a last sub-ADC in the pipeline is configured to generate a residue signal and feed the residue signal as the input signal to a succeeding sub-ADC in the pipeline. At least one sub-ADC is configured to determine a most-significant bit (MSB) of the pre-configured number of digital bits while the input signal is sampled. The ADC may include a plurality of residue amplifiers for amplifying a residue signal. The sub-ADCs may be successive approximation register (SAR) ADCs or flash ADCs.

20 Claims, 24 Drawing Sheets

(56) References Cited

OTHER PUBLICATIONS

Wenning Jiang, et al., "A Temperature-Stabilized Single-Channel 1-GS/s 60-dB SNDR SAR-Assisted Pipelined ADC With Dynamic Gm-R-Based Amplifier", IEEE Journal of Solid-State Circuits, vol. 55, No. 2, pp. 322-332, Feb. 2020.
Siddharth Devarajan et al., "A 12-b 10-GS/s Interleaved Pipeline ADC in 28-nm CMOS Technology", IEEE Journal of Solid-State Circuits, vol. 52, No. 12, pp. 3204-3218, Dec. 2017.
Zhu Yan et al: "An 11b 450 MS/s Three-Way Time-Interleaved Subranging Pipelined-SAR ADC in 65 nm CMOS", IEEE Journal of Solid-State Circuits; IEEE, USA, vol. 51, No. 5, May 1, 2016, pp. 1223-1234, XP011611624, ISSN: 0018-9200, DOI: 10.1109/JSSC.2016.2522762.
Shan Jiang et al: "An 8-bit 200-MSample/s Pipelined ADC With Mixed-Mode Front-End S/H Circuit", IEEE Transactions on Circuits and Systems I: Regular Papers, IEEE, US, vol. 55, No. 6, Jul. 1, 2008, pp. 1430-1440, XP011224738, ISSN: 1549-8328, DOI: 10.1109/TCSI.2008.916613.

\* cited by examiner

ANALOG-TO-DIGITAL CONVERTER

FIELD

Examples relate to an analog-to-digital converter (ADC), more particularly an ADC having a capability of determining a most-significant bit (MSB) while an input signal is sampled.

BACKGROUND

A pipelined ADC has become a widely used ADC architecture for high sampling rate applications. A resolution of the pipelined ADC may range, for example, from 8 bits to 16 bits. The pipelined ADC may be applied to many different applications, including medical imaging, digital receivers, communications, digital video, cable modems, etc.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
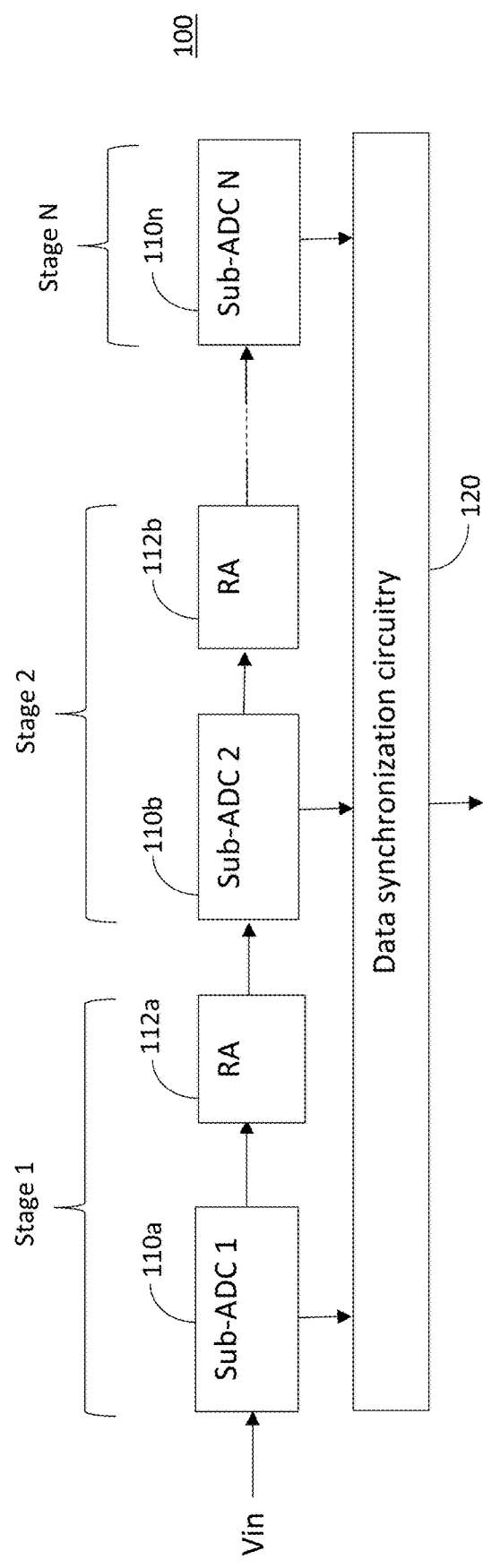
FIG. 1 is a schematic diagram of a pipelined ADC in accordance with one example.

FIG. 1 is a schematic diagram of a pipelined ADC in accordance with one example. The ADC 100 is configured to convert an analog signal to digital bits in multiple stages that are pipelined. A pipeline is a set of processing components connected in series where an output of one component is fed to an input of the next component and the processing by the components are performed simultaneously in a time sliced fashion. Pipelined processing refers to overlapping operations with all stages of the pipeline performing simultaneously. The number of stages may be two, three, four, or any number. The ADC 100 includes a plurality of sub-ADCs 110*a*, 110*b*, . . . , 110*n* that are cascaded in a pipeline. Multiple low-resolution sub-ADCs 110*a*, 110*b*, . . . , 110*n* may be cascaded to obtain a high-resolution output. Each sub-ADC 110*a*, 110*b*, . . . , 110*n* performs an analog-to-digital conversion on an input signal to each sub-ADC 110*a*, 110*b*, . . . , 110*n*. Each sub-ADC 110*a*, 110*b*, except the last sub-ADC 110*n*, generates a residue signal, which is fed to a succeeding sub-ADC and converted to digital bits by the succeeding sub-ADC. The sub-ADCs 110*a*, 110*b*, . . . , 110*n* may be a successive approximation register (SAR) ADC, a flash-based ADC, or any other type of ADC.

Each of the plurality of sub-ADCs 110*a*, 110*b*, . . . , 110*n* may be configured to sample an input signal that is fed to each sub-ADC 110*a*, 110*b*, . . . , 110*n* and convert the sampled input signal to a pre-configured number of digital bits (e.g., 2 bits, 3 bits, 4 bits, or any number of bits). Each of the plurality of sub-ADCs 110*a*, 110*b* except the last sub-ADC 110*n* in the pipeline is configured to generate a residue signal that is fed as an input signal to a succeeding sub-ADC in the pipeline. The first sub-ADC 110*a* receives an analog signal Vin and generates a pre-configured number of digital bits and a residue signal and feeds the residue signal to a second sub-ADC 110*b*. The second sub-ADC 110*b* generates a pre-configured number of digital bits from the residue signal received from the first sub-ADC 110*a* and generates a residue signal and feeds the residue signal to a third sub-ADC, and so on. This processing is repeated until the last sub-ADC 110*n* in the pipeline. The last sub-ADC 110*n* generates a pre-configured number of digital bits from the residue signal received from the preceding sub-ADC.

The ADC 100 may include a plurality of residue amplifiers 112*a*, 112*b*. Residue amplifiers 112*a*, 112*b*, . . . , 112*n* are coupled between two consecutive sub-ADCs (110*a* and 110*b*), (110*b* and 110*c*) . . . (110*n*-1 and 110*n*), respectively and amplifies a residue signal output from a preceding sub-ADC in the pipeline and feeds the amplified residue signal to a succeeding sub-ADC in the pipeline. The ADC 100 includes a data synchronization circuitry 120 configured to time-align the digital bits output from the plurality of sub-ADCs 110*a*, 110*b*, 110*n* and combine them to an ADC output.

The processing of the stages is pipelined such that when each stage finishes processing an input signal, determining the digital bits, and passing the residue signal to the next stage, each stage can start processing for the next sample which is captured by a sample-and-hold circuit included in each stage. This pipelining operation can increase the throughput of the ADC.

It should be noted that the examples will be explained hereinafter with reference to a pipelined ADC. However, the examples disclosed herein can be applied to both a pipelined ADC and a non-pipelined ADC.

In examples, at least one sub-ADC among the plurality of sub-ADCs 110*a*, 110*b*, . . . , 110*n* is configured to determine a most-significant bit (MSB) of the pre-configured number of digital bits of the sub-ADC while the input signal is being sampled. Instead of initiating the digital bit conversion at the sub-ADCs after the sampling of the input signal is complete, the MSB may be determined while the input signal is being sampled in at least one of the stages.

This scheme can reduce the processing time (for comparison operations) and enhance the processing speed of the ADC. This scheme can also save the processing power. In case of flash ADC, the flash ADC can be implemented with fewer number of comparators in accordance with this scheme. For example, a 4-bit flash ADC would need 15 or 16 comparators. With this scheme, a 4-bit flash ADC would need 8 or 9 comparators (7 or 8 comparators for a 3-bit flash ADC and one additional comparator for the MSB determination) so that the number of needed comparators can be reduced.

Figure 2A:
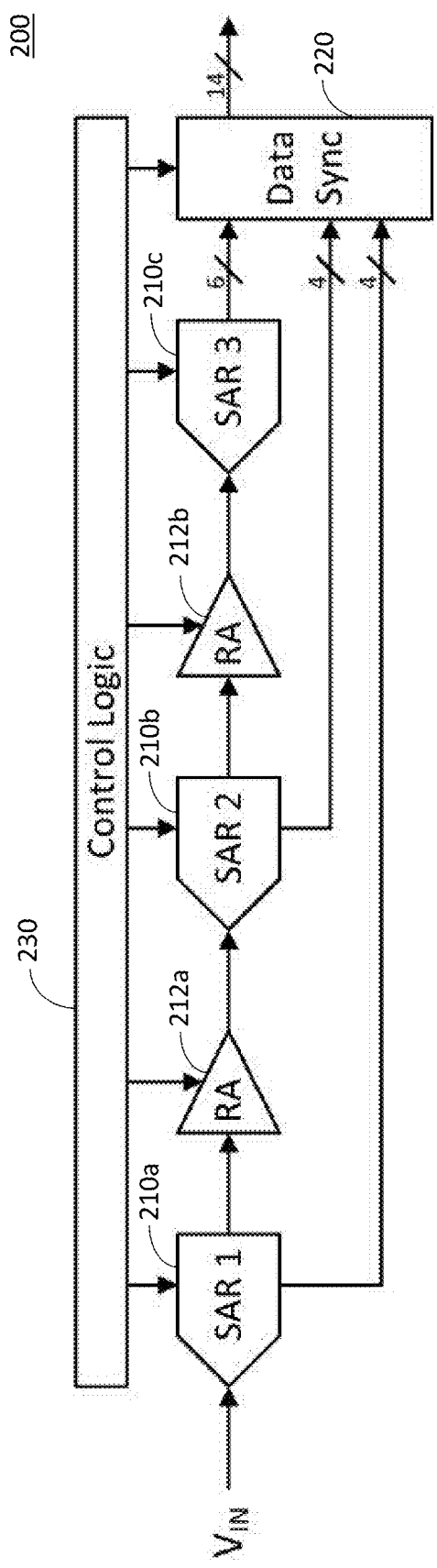
FIG. 2A is a diagram of an example ADC using successive approximation register (SAR) ADCs in accordance with one example.

FIG. 2A is a diagram of an example ADC 200 using SAR ADCs in accordance with one example. The ADC 200 is configured to convert an analog signal (Vin) to digital bits in multiple stages that are pipelined. It should be noted that FIG. 2A shows an ADC 200 including three stages as an example, but the number of stages may be two, three, four, or any number.

Figure 4:
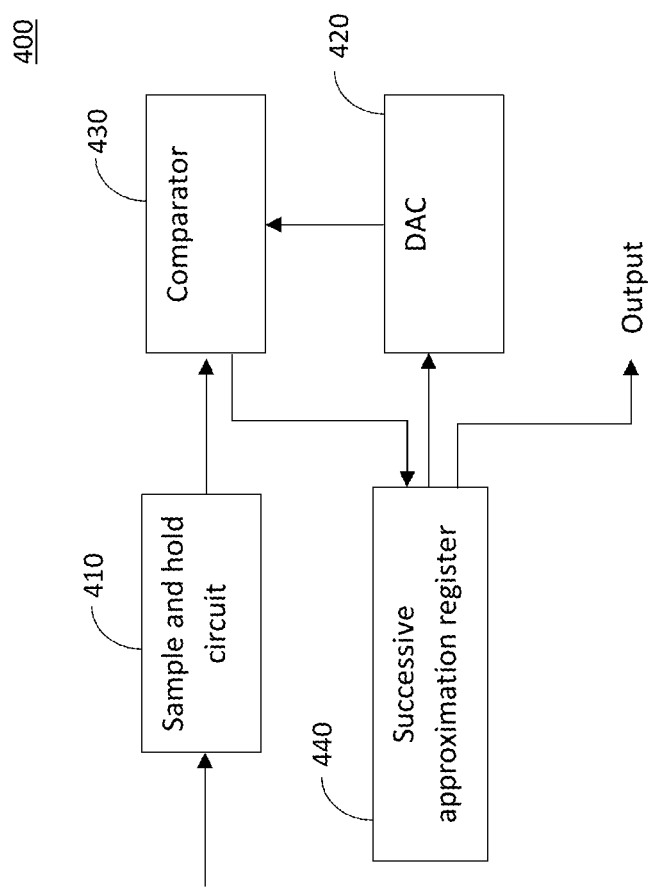
FIG. 4 is a schematic block diagram of an example SAR ADC.

An SAR ADC is a type of ADC that converts an input analog signal to a digital signal using a binary search in multiple iterations. FIG. 4 is a schematic block diagram of an example SAR ADC 400. The SAR ADC 400 includes a sample-and-hold circuit 410, a DAC 420, a comparator 430, and a successive approximation register 440. The sample and hold circuitry 410 (e.g. a capacitor and a switch) is an analog device configured to sample the voltage of the analog signal and hold its value for a certain period of time. The sample-and-hold circuit 410 is configured to capture an input analog signal and generate a hold sample of the input analog signal. The DAC 420 is an internal reference DAC configured to generate an iterative sample corresponding to a digital code. The comparator 430 is configured to compare the hold sample and the iterative sample and generate a decision signal based on the comparison. The successive approximation register 440 is configured to update the digital code for each iteration based on the decision signal and supply the updated digital code to the DAC 420, and generate ADC output bits at the end of conversion.

Referring to FIG. 2A, the ADC 200 includes a plurality of sub-ADCs 210*a*-210*c* (i.e. SAR ADCs in this example) that are cascaded in a pipeline. Multiple low-resolution sub-ADCs 210*a*-210*c* may be cascaded to obtain a high-resolution output. Each sub-ADC 210*a*-210*c* performs an analog-to-digital conversion on an input signal. Each sub-ADC 210*a*, 210*b*, except the last sub-ADC 210*c*, generates a residue signal for a succeeding sub-ADC.

Each of the plurality of sub-ADCs 210*a*-210*c* may be configured to sample an input signal that is fed to each sub-ADC 210*a*-210*c* and convert the sampled input signal to a pre-configured number of digital bits (e.g., 2 bits, 3 bits, 4 bits, or any number of bits). It should be noted that FIG. 2A shows an ADC 200 with a total resolution of 14 bits including 4 bits from the first sub-ADC 210*a*, 4 bits from the second sub-ADC 210*b*, and 6 bits from the third sub-ADC 210*c* as an example, but the resolution of the sub-ADCs 210*a*-210*c* and the total resolution of the ADC 200 may be any value.

Each of the plurality of sub-ADCs 210*a*, 210*b* except the last sub-ADC 210*c* in the pipeline is configured to generate a residue signal that is fed as an input signal to a succeeding sub-ADC in the pipeline. The first sub-ADC 210*a* receives an analog signal Vin and generates a pre-configured number of digital bits and a residue signal and feeds the residue signal to a second sub-ADC 210*b*. The second sub-ADC 210*b* generates a pre-configured number of digital bits from the residue signal received from the first sub-ADC 210*a* and generates a residue signal and feeds the residue signal to a third sub-ADC 210*c*. The third sub-ADC 210*c* generates a pre-configured number of digital bits from the residue signal received from the second sub-ADC 210b.

The ADC 200 may include a plurality of residue amplifiers (RAs) 212a, 212b. Residue amplifiers 212a and 212b are, respectively, coupled between two consecutive sub-ADCs (210a and 210b) and (210b and 210c). Each residue amplifier 212a, 212b is configured to amplify a residue signal output from a preceding sub-ADC in the pipeline and feed the amplified residue signal to a succeeding sub-ADC in the pipeline. The data synchronization circuitry 220 receives the digital bits from the plurality of sub-ADCs 210a-210c, time-aligns the digital bits, and combines them to an ADC output. A control logic 230 controls the timing of the operations of the sub-ADCs 210a-210c and the residue amplifiers 212a, 212b.

Figure 2B:
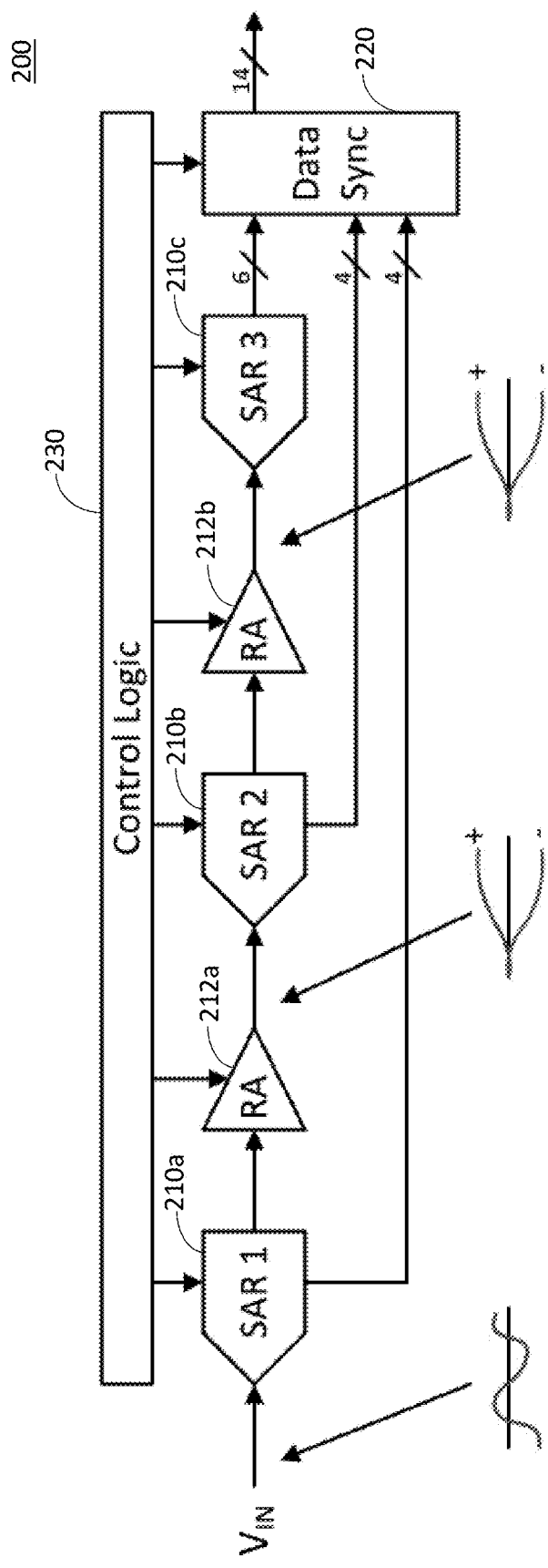
FIG. 2B shows example signal waveforms of the input analog signal (Vin) and the output signals from the residue amplifiers.

FIG. 2B shows example signal waveforms of the input analog signal (Vin) and the output signals from the residue amplifiers 212a and 212b. The analog signal Vin is sampled and processed by the first sub-ADC 210a, and a residue signal amplified by the residue amplifier 212a is sampled and processed by the second sub-ADC 210b, and a residue signal amplified by the residue amplifier 212b is sampled and processed by the third sub-ADC 210c.

In accordance with the examples disclosed herein, at least one sub-ADC among the plurality of sub-ADCs 210a-210c is configured to determine an MSB of the pre-configured number of digital bits of the sub-ADC while the input signal is being sampled. Instead of initiating the digital bit conversion at the sub-ADCs after the sampling of the input signal is complete, the MSB may be determined while the input signal is being sampled in at least one of the sub-ADCs 210a-210c.

Figure 3A:
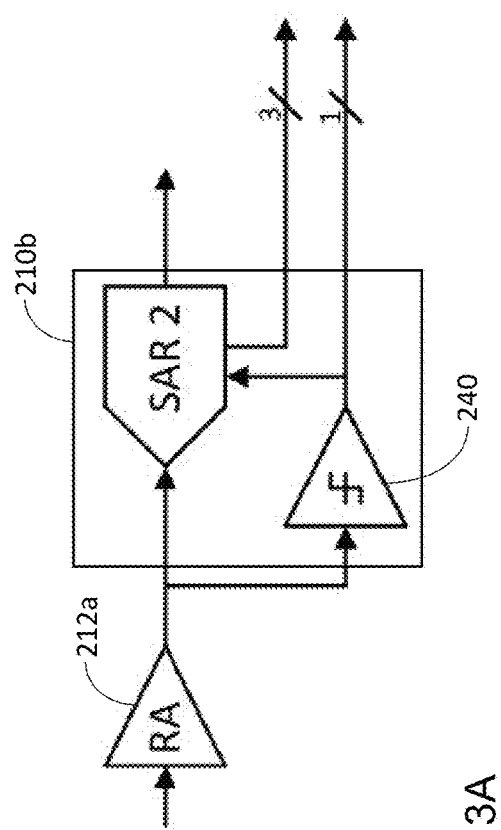
FIGS. 3A and 3B show an example structure of a sub-ADC for determining an MSB of the digital bits of the sub-ADC while the input signal that is fed to the sub-ADC is being sampled.

FIG. 3A shows an example structure of a sub-ADC (the second sub-ADC 210b of FIG. 2A in this example) for determining an MSB of the digital bits of the sub-ADC 210b while the input signal that is fed to the sub-ADC is being sampled. As shown in FIG. 3A, a comparator 240 may be provided to be coupled to an output of the residue amplifier of the preceding stage (residue amplifier 212a in this example) to determine the MSB while the residue signal is being sampled. A switch, a resistor, a capacitor, or the like may be provided between the residue amplifier 212a and the comparator 240. The residue signal from the first sub-ADC 210a is amplified by the residue amplifier 212a and the comparator 240, for example, may compare the output of the residue amplifier 212a to a reference voltage to determine the MSB (among the output bits from the second sub-ADC 210b) while the residue signal from the first stage is being amplified by the residue amplifier 212a and sampled by the second sub-ADC 210b (by the sample-and-hold circuit in the second sub-ADC 210b). Alternatively, if the input signal is differential, the sign of the input signal may be compared (if Vinp>Vinn) to determine the MSB. The comparison result from the comparator 240 (i.e. one bit corresponding to the MSB of the second sub-ADC output) is sent to the second sub-ADC 210b to set the internal digital code for the successive approximation processing to determine the second MSB. The comparison result from the comparator 240 is also sent to the data synchronization circuitry 220. In this example, the second sub-ADC 210b generates four bits as shown in FIG. 2A. Among the four bits, the MSB is determined by the comparator 240, and the second sub-ADC 210b generates the remaining three bits.

Figure 3B:
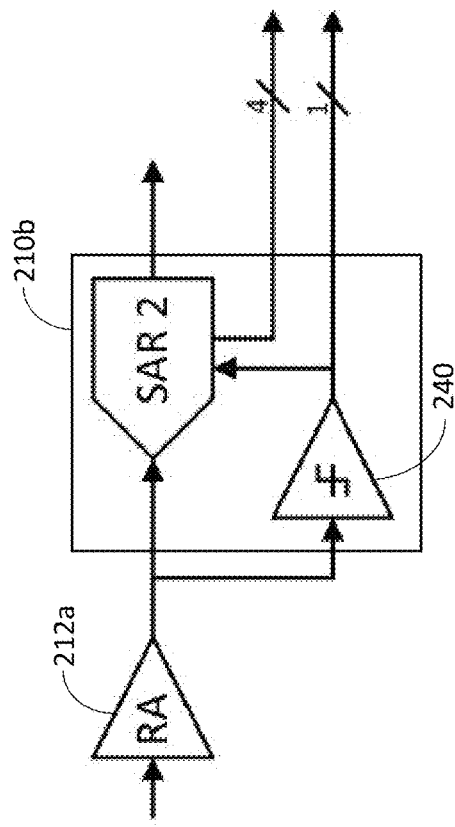

The resolution of the sub-ADCs 210a-210c may be any value. For example, the second sub-ADC 210b may generate a five-bit output, and among the five bits, the MSB may be determined by the comparator 240 while the residue signal is being sampled and the remaining four bits may be (successively) generated by the second sub-ADC 210b as shown in FIG. 3B.

This scheme for determining the MSB while the input signal (the analog signal Vin or the residue signal) is being sampled may be used for any sub-ADCs 210a-210c in the pipeline including the first sub-ADC 210a and the last sub-ADC 210c. For example, similar to the structures shown in FIGS. 3A and 3B, a comparator may be coupled to the input of the first sub-ADC 210a and/or to the output of the second residue amplifier 212b to determine the MSB of the first sub-ADC 210a and/or the MSB of the third sub-ADC 210c, respectively.

Figure 5A:
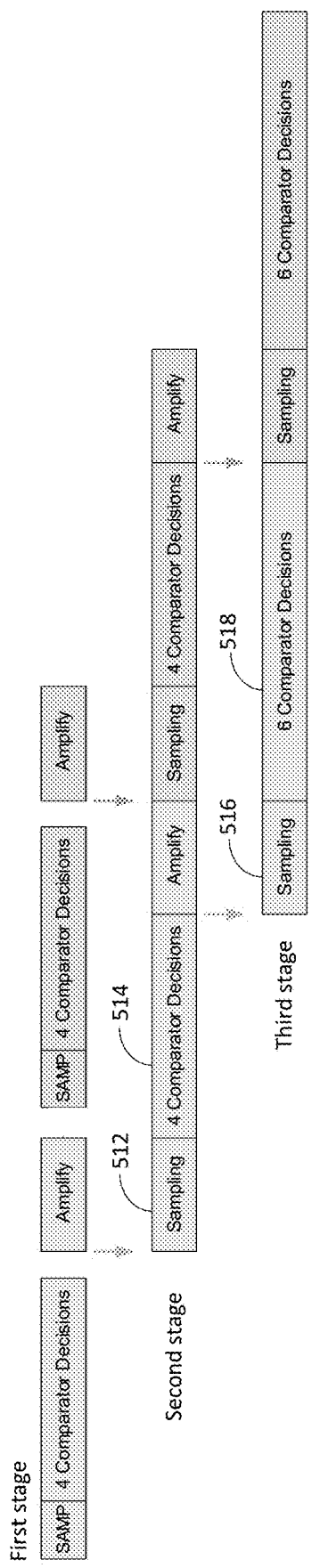
FIGS. 5A and 5B show 3-stage pipelined operations of the ADC without and with determining the MSB while the input signal is being sampled by a sub-ADC, respectively.

FIG. 5A shows a 3-stage pipelined operation of the ADC without determining the MSB while the input signal is being sampled by a sub-ADC. In FIG. 5A, the second stage bit conversion operation 514 starts after completing the sampling 512 of the residue signal from the first stage and the third stage bit conversion operation 518 starts after completing the sampling 516 of the residue signal from the second stage.

Figure 5B:
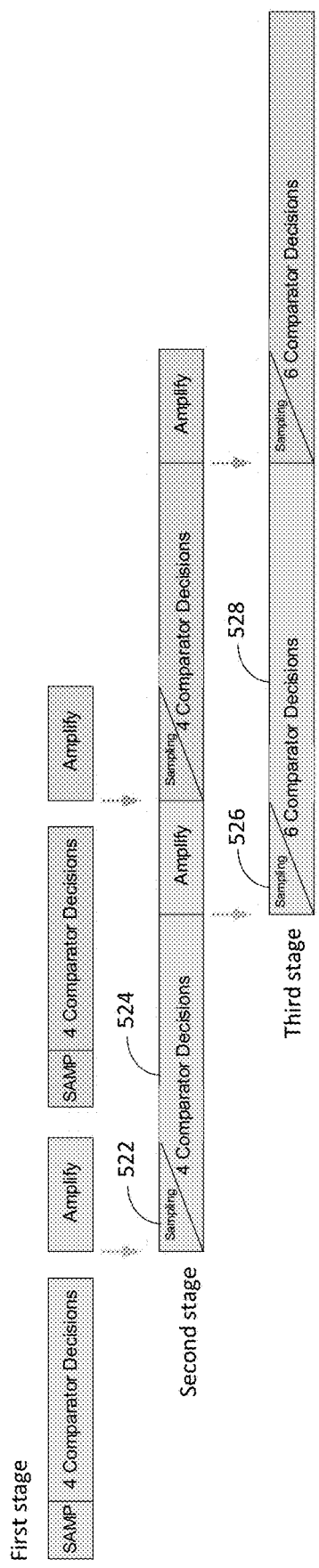

FIG. 5B shows an example 3-stage pipelined operation of the ADC with determining the MSB while the input signal is being sampled by a sub-ADC. In FIG. 5B, the second stage bit conversion operation 524 starts while the residue signal from the first stage is being sampled (i.e. the sampling 522 of the residue signal from the first stage and a bit conversion for the MSB of the second stage are performed simultaneously), and the third stage bit conversion operation 528 starts while the residue signal from the second stage is being sampled (i.e. the sampling 526 of the residue signal from the second stage and a bit conversion for the MSB of the third stage are performed simultaneously).

Figure 6A:
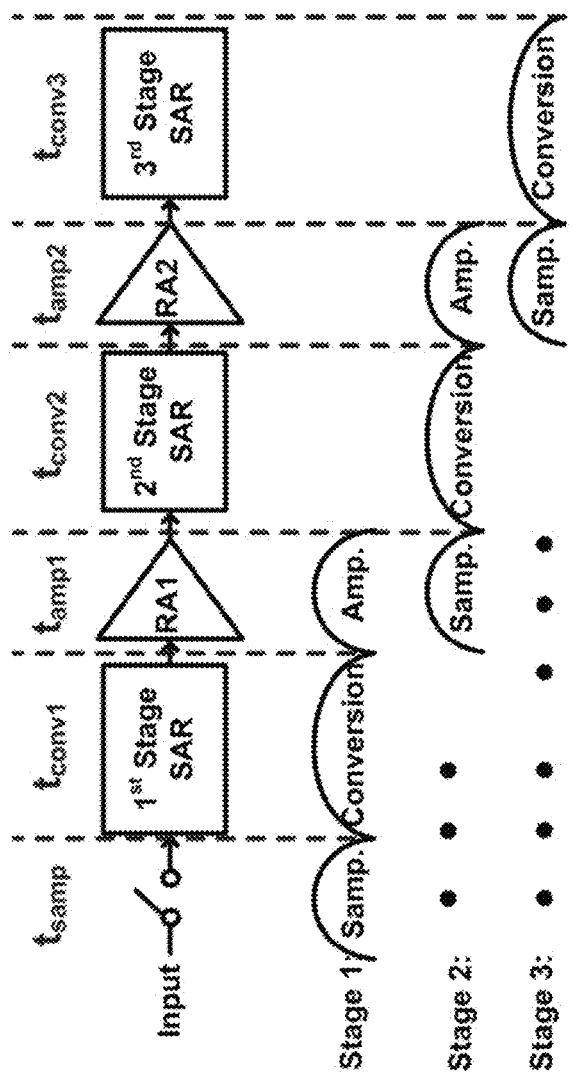
FIGS. 6A and 6B show 3-stage pipelined operations of the ADC without and with determining the MSB while the input signal is being sampled by a sub-ADC, respectively.
Figure 6B:
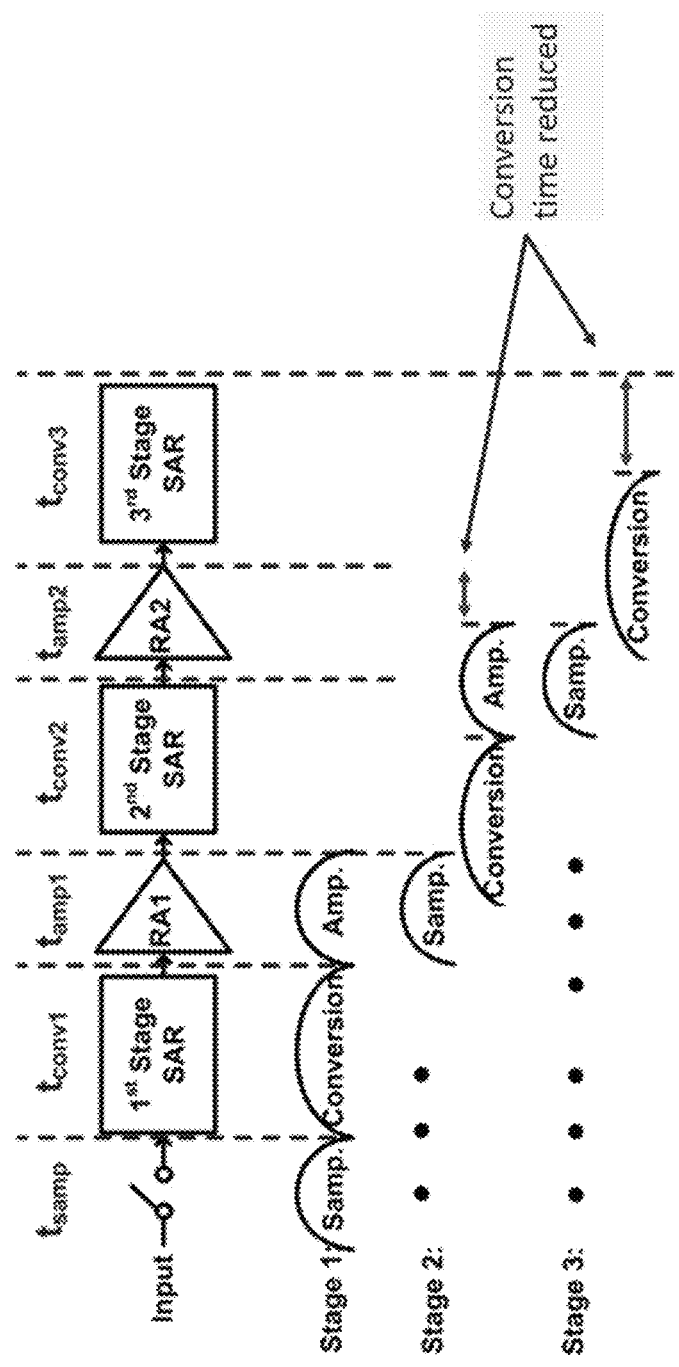

FIGS. 6A and 6B show 3-stage pipelined operations of the ADC without and with determining the MSB while the input signal is being sampled by a sub-ADC, respectively. As shown in FIG. 6A, without determination of the MSB while the residue signal is being sampled, the second and third stage bit conversion operations start after completing the sampling of the residue signal from the first and second stages, respectively.

In a pipelined SAR ADC, there is a limited time per stage to do the conversion of the bits. For example, in the ADC of FIG. 2A, especially in the middle stage where roughly half the available time is used to sample the voltage from the preceding stage, and then also let the next stage sample the voltage from the current stage. With determination of the MSB while the residue signal is being sampled, as shown in FIG. 6B, the second and third stage bit conversion operations may start before completing the sampling of the residue signal from the first and second stages, respectively, and the conversion time can be reduced as illustrated in FIG. 6B. FIG. 6B does not show it but this scheme can be used for the first stage as well. This scheme may save power consumption, reduce processing time (e.g. for comparison operations), and increase a processing speed.

Figure 7A:
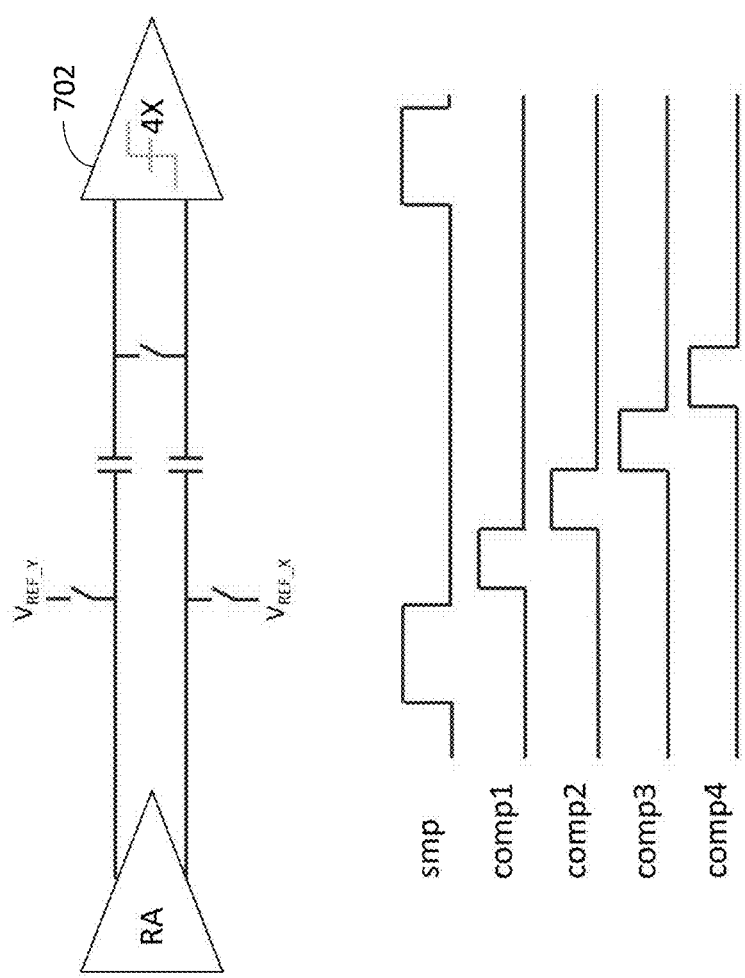
FIGS. 7A and 7B show sampling and bit conversion operations of an SAR ADC without and with determining the MSB while the input signal is being sampled by a sub-ADC, respectively.
Figure 7B:
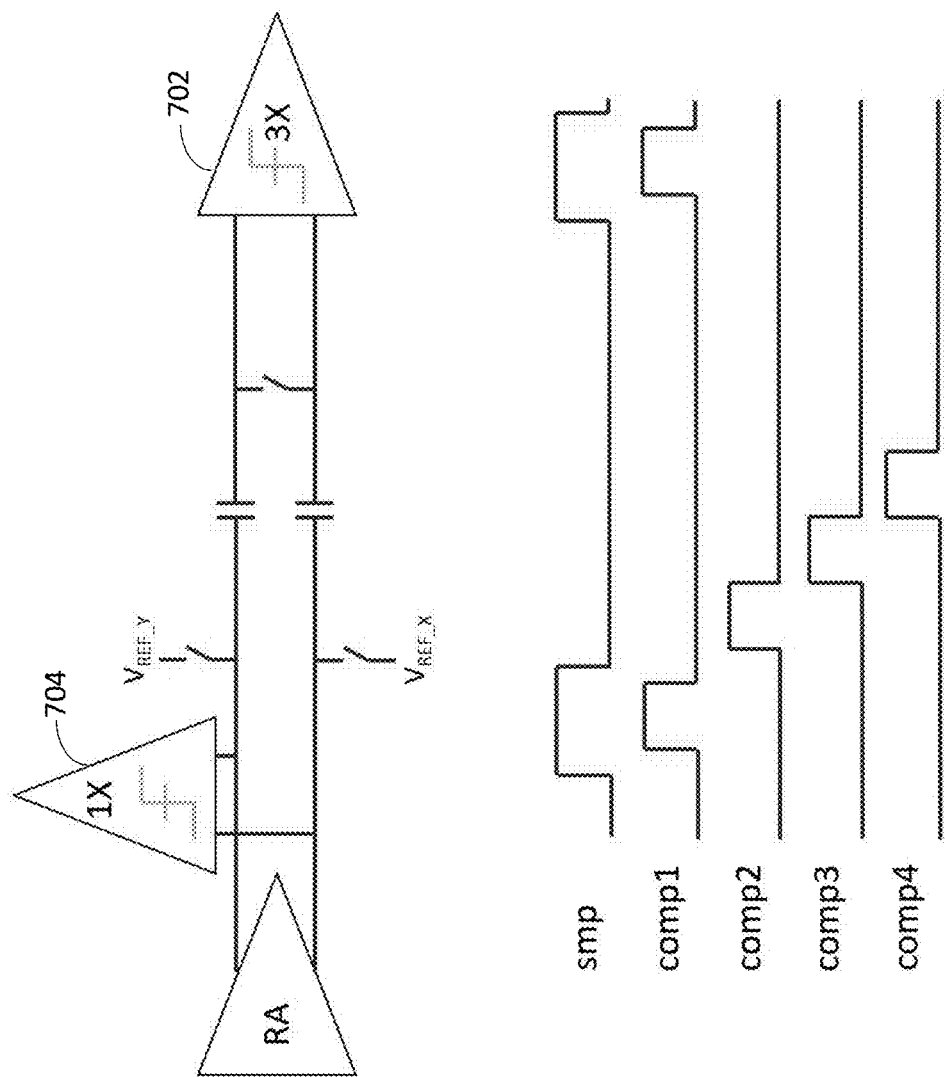

FIGS. 7A and 7B show sampling and bit conversion operations (4-bit resolution) of an SAR ADC without and with determining the MSB while the input signal is being sampled by a sub-ADC, respectively. As shown in FIG. 7A, without MSB pre-determination, 4 comparison operations are performed by a comparator 702 consecutively after completion of sampling the residue signal from the preceding stage. In contrast, as shown in FIG. 7B, the MSB may be determined by an additional comparator 704 while the input signal is being sampled and with the MSB determination during the sampling process, smaller number of comparison operations (3 in this example) need to be performed by the comparator 702 after completion of the sampling, which reduces the overall processing time.

Figure 8A:
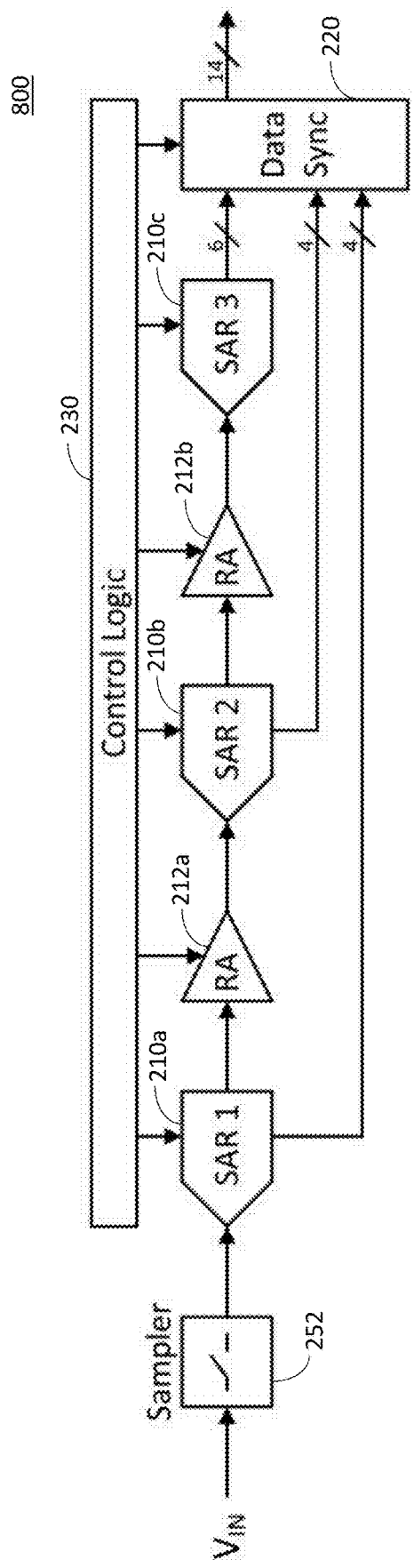
FIG. 8A is a diagram of an example ADC in accordance with another example.

FIG. 8A is a diagram of an example ADC 800 in accordance with another example. The structure of the ADC 800 in FIG. 8A is the same as the ADC 200 shown in FIG. 2A except that a sampler 252 is provided at the input of the first sub-ADC 210a. Therefore, the components of the ADC 200 that are explained above with reference to FIG. 2A will not be explained again for simplicity.

Figure 8B:
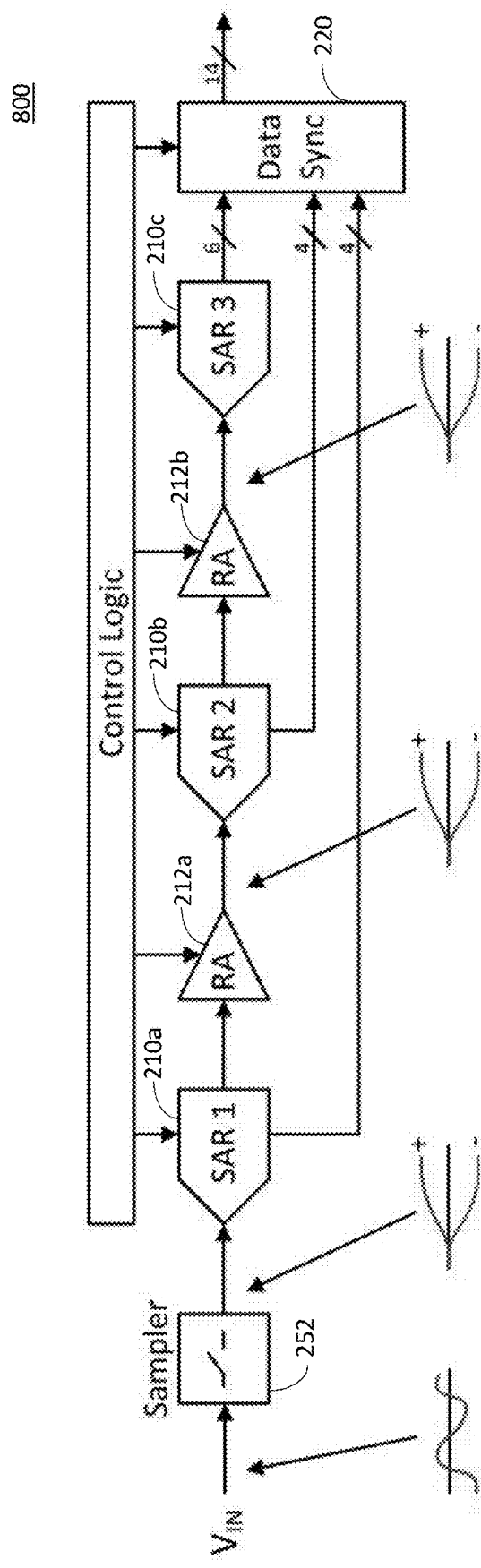
FIG. 8B shows example signal waveforms of the input analog signal (Vin) and the output signals from the sampler and the residue amplifiers.

The sampler 252 (e.g. a sample and hold circuitry) may be provided at the input of the first sub-ADC 210a to sample the input analog signal Vin. The first sub-ADC 210a then samples the output signal from the sampler 252, converts the sampled signal to a pre-configured number of digital bits (e.g. 4 bits, or any number of bits), and generates a residue signal for the second sub-ADC 210b. Provision of the sampler 252 at the input of the first sub-ADC 210a may help determining the MSB of the first sub-ADC output while the input signal (Vin) is being sampled by the first sub-ADC 210a. FIG. 8B shows example signal waveforms of the input analog signal (Vin) and the output signals from the sampler 252 and the residue amplifiers 212a and 212b. Instead of feeding the input analog signal Vin, which may be at extremely high frequency, directly to the additional comparator for MSB determination in the first sub-ADC 210a (such as the comparator 240 in FIGS. 3A and 3B), by feeding the sampled analog signal Vin by the sampler 252 to the first sub-ADC 210a (i.e. to the additional comparator for MSB determination in the first sub-ADC 210a), the MSB determination while the input analog signal Vin is being sampled in the first sub-ADC 210a can be more stably performed.

Figure 9A:
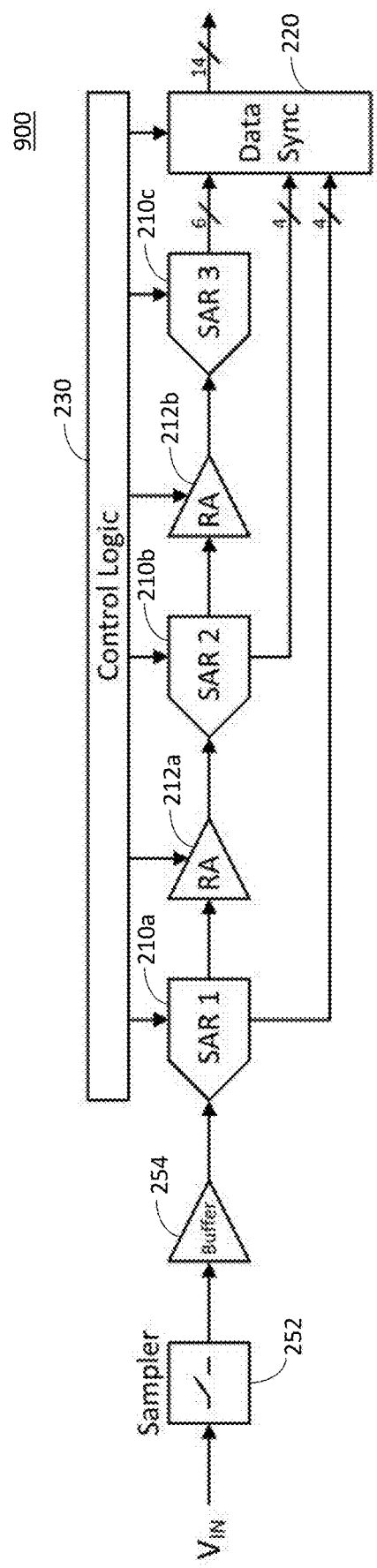
FIG. 9A is a diagram of an example ADC in accordance with yet another example.
Figure 9B:
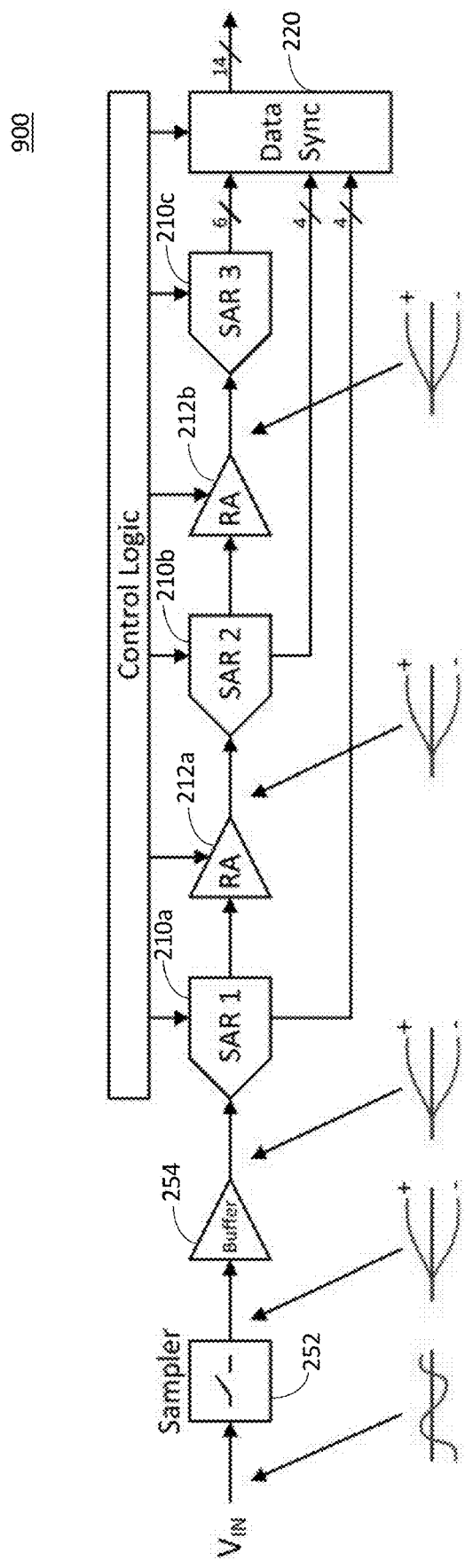
FIG. 9B shows example signal waveforms of the input analog signal (Vin), and the output signals from the sampler, the buffer, and the residue amplifiers.

FIG. 9A is a diagram of an example ADC 900 in accordance with yet another example. The structure of the ADC 900 in FIG. 9A is the same as the ADC 200/800 shown in FIGS. 2A and 8A except that a buffer 254 is provided at the input of the first sub-ADC 210a. Therefore, the components of the ADC 200/800 that are explained above with reference to FIGS. 2A and 8A will not be explained again for simplicity. FIG. 9B shows example signal waveforms of the input analog signal (Vin), and the output signals from the sampler 252, the buffer 254, and the residue amplifiers 212a and 212b. A buffer 254 may be provided at the input of the first sub-ADC 210a after the sampler 252. The buffer 245 may be a unity gain amplifier to pass signals to a succeeding stage. The buffer 254 may have a certain transfer function, for example amplification, attenuation, or other transfer function. The buffer 254 may be provided to prevent loss in signal amplitude, or to make a common mode voltage shift.

Figure 10A:
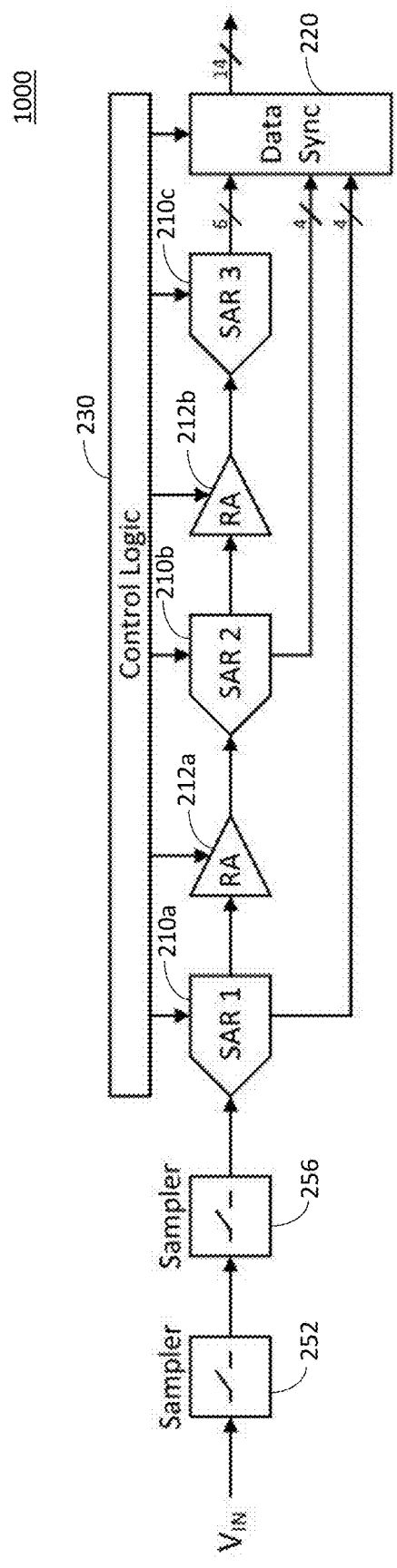
FIG. 10A is a diagram of an example ADC in accordance with still another example.
Figure 10B:
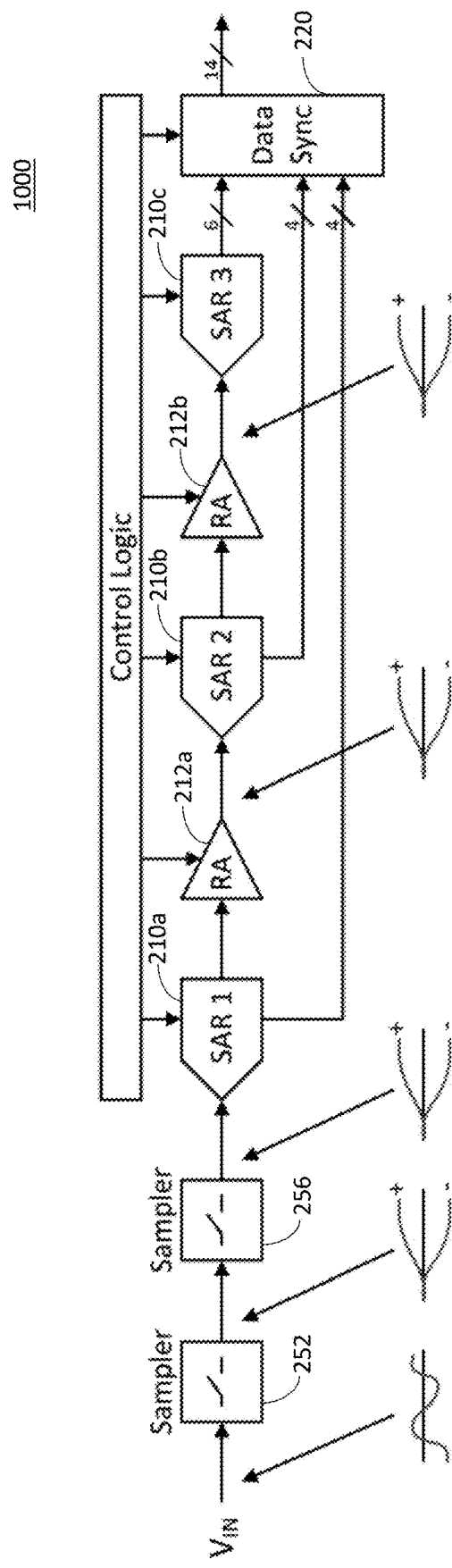
FIG. 10B shows example signal waveforms of the input analog signal (Vin), and the output signals from the samplers, and the residue amplifiers.

FIG. 10A is a diagram of an example ADC 1000 in accordance with still another example. The structure of the ADC 1000 in FIG. 10A is the same as the ADC 200/800/900 shown in FIGS. 2A, 8A, and 9A except an additional sample 256. Therefore, the components of the ADC 200/800/900 that are explained above with reference to FIGS. 2A, 8A, and 9A will not be explained again for simplicity. FIG. 10B shows example signal waveforms of the input analog signal (Vin), and the output signals from the sampler 252, the sampler 256, and the residue amplifiers 212a and 212b. More than one sampler may be provided in series before the first sub-ADC 201a. The sampler 252 may sample the input analog signal Vin, and the sampler 256 may sample the output signal of the sampler 252, and the first sub-ADC 210a then samples the output signal from the sampler 256, converts the sampled signal to a pre-configured number of digital bits (e.g. 4 bits), and generates a residue signal for the second sub-ADC 210b. The additional sampler 256 may be provided to divide the physical length between Vin and the ADC into shorter paths, or to implement some other transfer function (like a switched cap filter).

Additionally, one or more buffers may be provided after the sampler 256 (e.g. like the buffer 254 shown in FIG. 9A) or between the samplers 252 and 256.

The examples disclosed herein may be applied to a time-interleaved ADC. Time interleaving is a technique that uses multiple identical ADCs in parallel to process the high-speed input samples at a faster rate than the operating speed of the individual constituent ADCs.

Figure 11A:
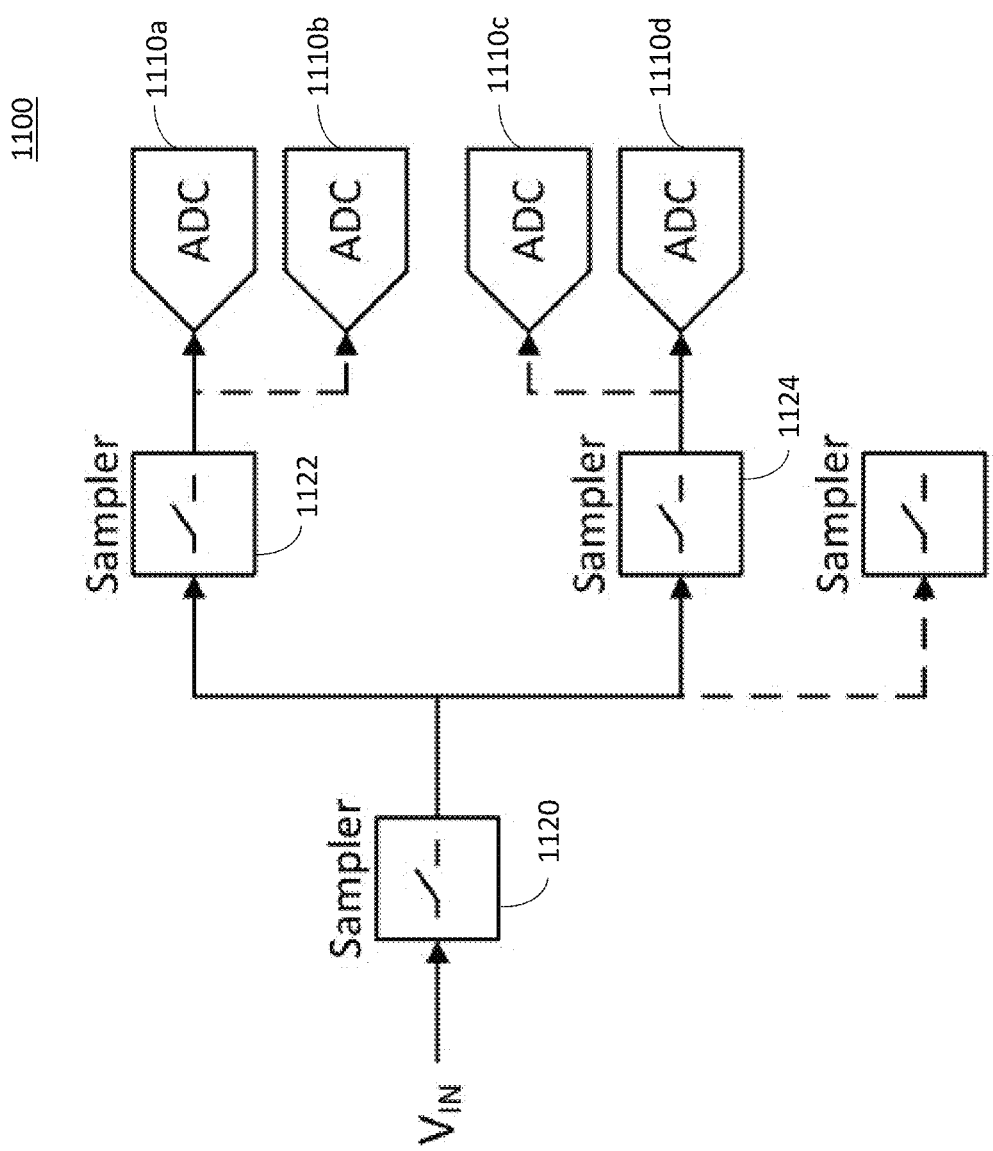
FIG. 11A is a diagram of an example time-interleaved ADC in accordance with one example.
Figure 11B:
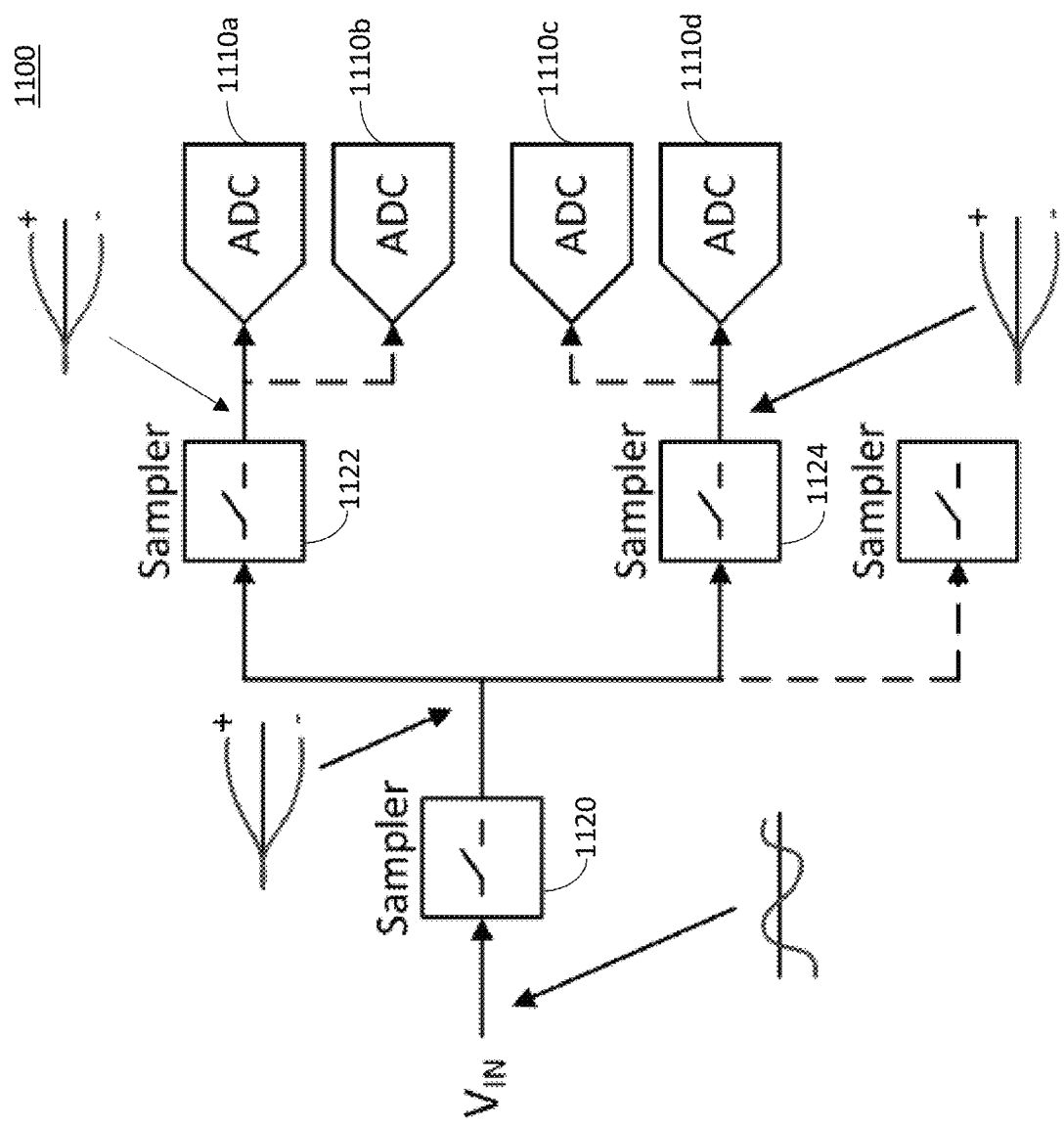
FIG. 11B shows example signal waveforms of the input analog signal (Vin) and the output signals from the sampler.

FIG. 11A is a schematic diagram of an example time-interleaved ADC 1100 in accordance with one example. The ADC 1100 includes an array of sub-ADCs 1110a-1110d that are arranged in parallel and time-switched sequentially. The input analog signal Vin may be sampled by one or more samplers 1120, 1122, 1124 and switched to one of the sub-ADCs 1110a-1110d. It should be noted that the structure shown in FIG. 11A is an example, and the number of sub-ADCs and/or the number of samplers may be any number. Additionally, as shown in FIG. 9A, a buffer may be provided after the sampler 1120, 1122, 1124. FIG. 11B shows example signal waveforms of the input analog signal (Vin), and the output signals from the sampler 1120, 1122, 1124.

Any one of the sub-ADCs 1110a-1110d may be configured to determine an MSB of the pre-configured number of digital bits of the sub-ADC 1110a-1110d while the input signal is being sampled. For example, any one of the sub-ADCs 1110a-1110d may include a comparator (e.g. like a comparator 240 shown in FIG. 3A or 3B) coupled to an input signal (e.g. to an output from the sampler 1122, 1124) to determine the MSB while the input signal is being sampled by the sub-ADCs 1110a-1110d. The sub-ADCs 1110a-1110d may be a non-pipelined ADC. Alternatively, the sub-ADCs 1110a-1110d may be a pipelined ADC as shown in any one of FIGS. 2A, 8A, 9A, 10A, and the MSB pre-determination scheme as disclosed above may be implemented in the sub-ADC(s) in the pipeline. The sub-ADCs 1110a-1110d may be an SAR ADC, a flash-based ADC, or any other type of ADC.

Figure 12A:
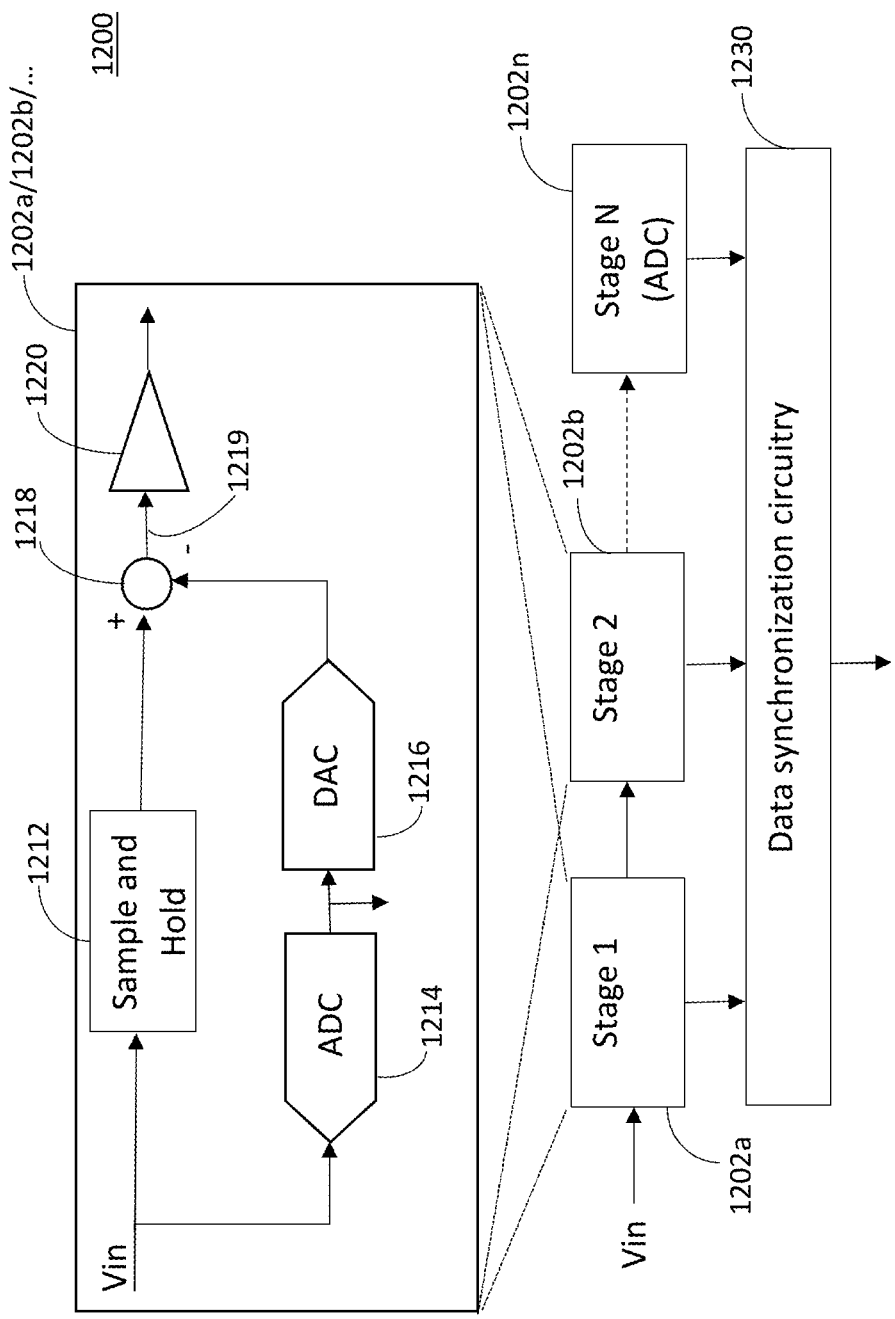
FIG. 12A is a schematic diagram of a pipelined ADC using a flash ADC in accordance with one example.

The examples disclosed herein may be applied to a flash ADC as well. FIG. 12A is a schematic diagram of a pipelined ADC using a flash ADC in accordance with one example. The ADC 1200 is configured to convert an analog signal to digital bits in multiple stages that are pipelined. The number of stages may be two, three, four, or any value. The ADC 1200 includes a plurality of stages 1202a, 1202b, . . . , 1202n that are cascaded in a pipeline. The resolution of each stage may be 2 bits, 3 bits, 4 bits, or any number of bits, and the resolution of the stages may be the same or different.

Each stage, except the last stage 1202n, includes a sample-and-hold circuit 1212, a sub-ADC 1214, an internal DAC 1216, a subtractor 1218, and a residue amplifier 1220. The last stage 1202n includes a sub-ADC 1214. The sub-ADC 1214 in each stage 1202a, 1202b, 1202n may be a flash ADC. A flash ADC is a type of ADC that uses a linear or non-linear voltage ladder with a comparator at each rung of the ladder to compare the input voltage to a successive reference voltages. The voltage ladder may be implemented with a resistor ladder or a capacitive voltage division circuitry. It should be noted that the examples disclosed herein can be applied not only to a pipelined ADC but also to a non-pipelined ADC.

The input signal (the analog signal Vin or the residue signal from the preceding stage) is sampled and held steady by a sample and hold circuit 1212, while the sub-ADC 1214 in each stage quantizes it to a certain number of bits (e.g., 2 bits, 3 bits, 4 bits, etc.). The output bits of the sub-ADC 1214 are then fed to an internal DAC 1216, and the analog output from the internal DAC 1216 is subtracted by a subtractor 1218 from the sampled input signal held by the sample and hold circuit 1212 to generate a residue signal 1219. The residue signal 1219 is then amplified by a residue amplifier 1220 and provided to a succeeding stage in a pipeline. This process is repeated in each stage through the pipeline, providing certain number of bits per stage until it reaches the last stage. The output bits from all stages 1202*a*, 1202*b*, . . . , 1202*n* are time-aligned and combined by the data synchronization circuitry 1230 to generate an ADC output.

The processing in the ADC 1200 is pipelined such that when each stage finishes processing a sampled input signal, determining the digital bits, and passing the residue signal to the next stage, each stage can then start processing the next sample received from the sample-and-hold circuitry embedded within each stage. A high throughput can be achieved by this pipelined processing.

In accordance with examples, at least one sub-ADC among the plurality of stages 1202*a*, 1202*b*, . . . , 1202*n* is configured to determine an MSB of the pre-configured number of digital bits of the stage while the input signal is being sampled. Instead of initiating the digital bit conversion at the sub-ADCs after the sampling of the input signal is complete, the MSB may be determined while the input signal is being sampled in at least one of the stages.

Figure 12B:
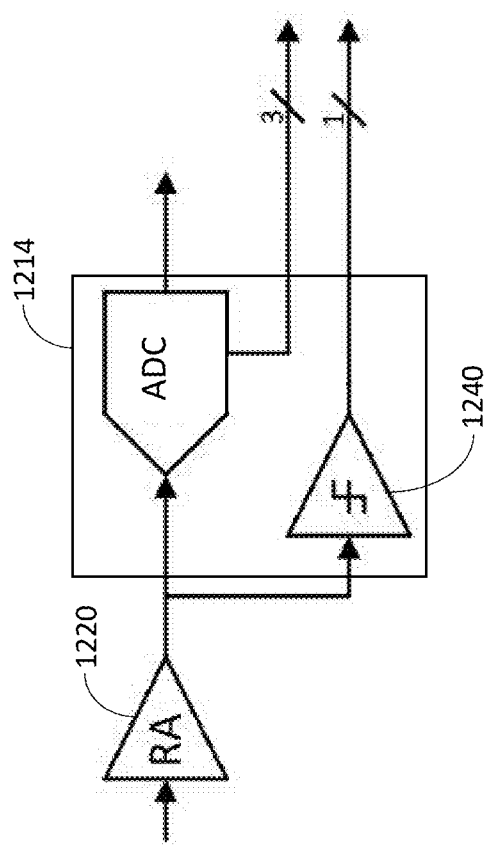
FIG. 12B shows an example structure of the sub-ADC for determining an MSB of the digital bits while the input signal that is fed to the subsequent stage is being sampled.

FIG. 12B shows an example structure of the sub-ADC 1214 for determining an MSB of the digital bits while the input signal that is fed to the subsequent stage is being sampled. As shown in FIG. 12B, a comparator 1240 may be provided to be coupled to an output of the residue amplifier of the preceding stage or to the input analog signal Vin to determine the MSB while the input signal is being sampled. For example, the comparator 1240 may compare the input signal (i.e. the output of the residue amplifier of the preceding stage or the sampled input analog signal Vin) to a reference voltage and determines the MSB (among the output bits of each stage) while the input signal is being sampled by the sample-and-hold circuit 1212. Alternatively, if the input signal is differential, the sign of the input signal may be compared (if Vinp>Vinn) to determine the MSB. The remaining bits are determined by the sub-ADC. With this scheme, a flash-based sub-ADC 1214 can be implemented with fewer number of comparators. For example, a 4-bit flash-based ADC would need 15 or 16 comparators without the scheme disclosed herein. However, with the disclosed scheme of determining the MSB while the residue signal is being sampled, the 4-bit flash-based ADC may be implemented with 8 or 9 comparators (7 or 8 comparators for 3-bit flash-based ADC and an additional comparator for MSB determination).

This scheme may be implemented in any stage of the ADC 1200. For implementing the MSB pre-determination scheme at the first stage 1202*a*, as shown in FIGS. 8A, 9A, 10A, one or more samplers (such as the samplers 252 and/or 256 in FIGS. 8A and 10A) for sampling the input analog signal Vin and/or a buffer (such as the buffer 254 in FIG. 9A) for buffering the sampled input analog signal Vin may be provided at the input of the first stage 1202*a*.

Figure 13:
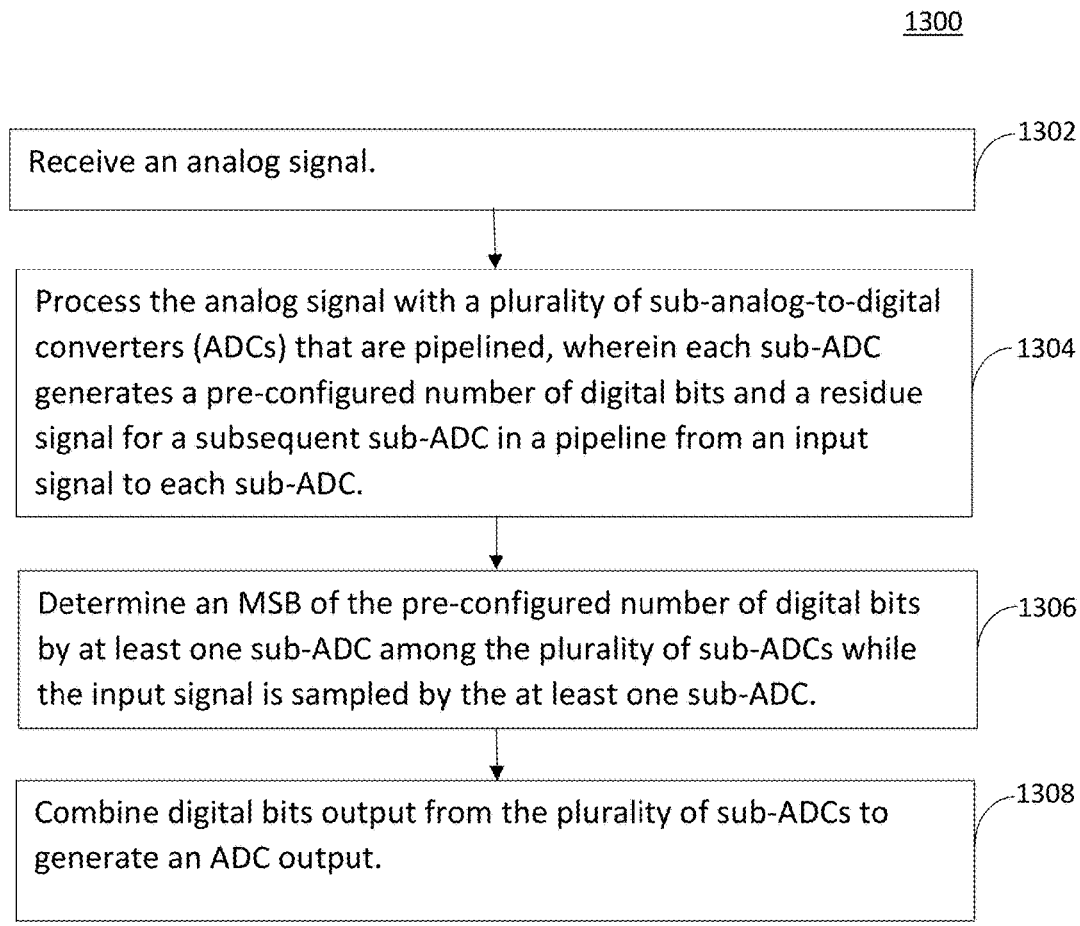
FIG. 13 is a flow diagram of an example method for converting an analog signal to digital bits in accordance with one example.

FIG. 13 is a flow diagram of an example method for converting an analog signal to digital bits in accordance with one example. The method 1300 includes receiving an analog signal (1302). The method further includes processing the analog signal with a plurality of sub-ADCs that are pipelined (1304). Each sub-ADC may generate a pre-configured number of digital bits and a residue signal for a subsequent sub-ADC in a pipeline from an input signal to each sub-ADC. The method further includes determining an MSB of the pre-configured number of digital bits by at least one sub-ADC among the plurality of sub-ADCs while the input signal is sampled by the at least one sub-ADC (1306). The method further includes combining digital bits output from the plurality of sub-ADCs to generate an ADC output (1308).

Figure 14:
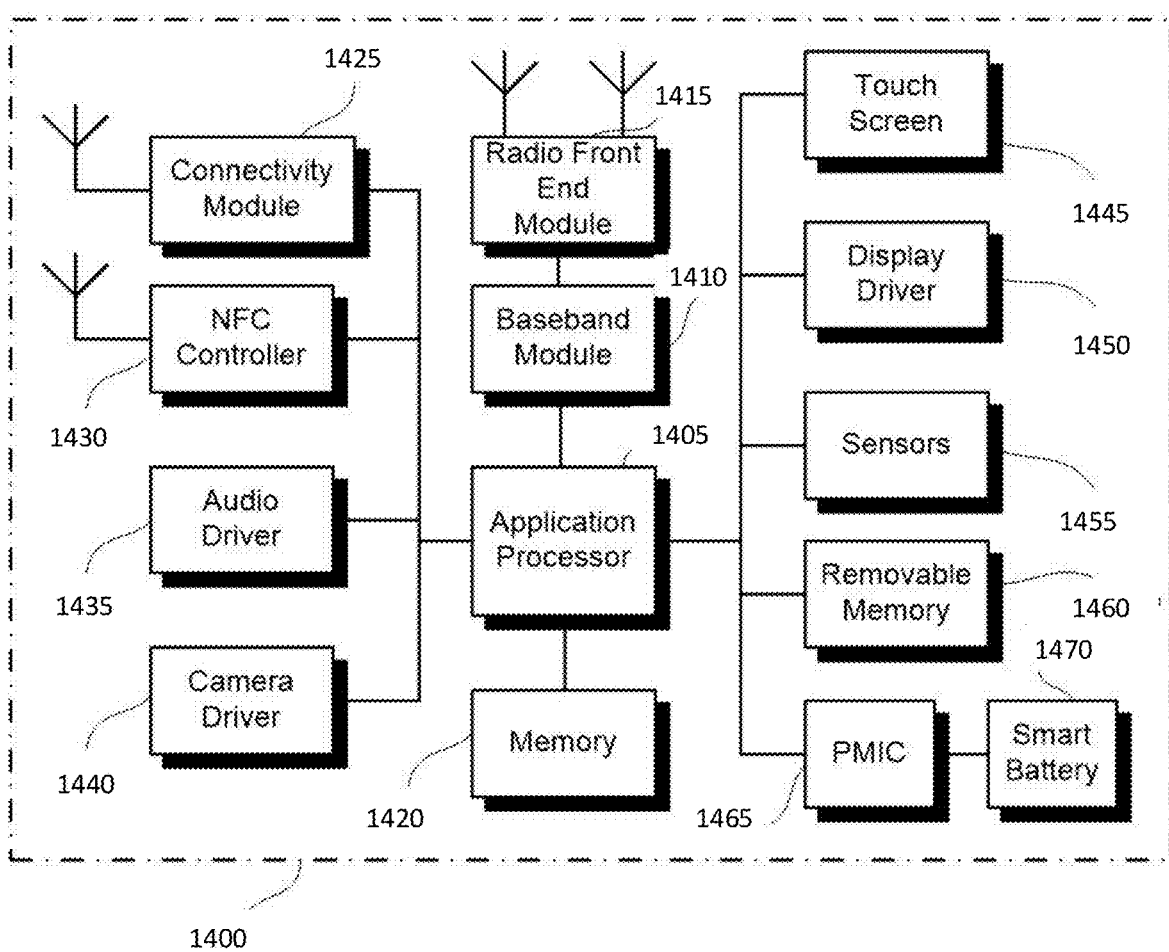
FIG. 14 illustrates a user device in which the examples disclosed herein may be implemented.

FIG. 14 illustrates a user device 1400 in which the examples disclosed herein may be implemented. For example, the examples disclosed herein may be implemented in the radio front-end module 1415, in the baseband module 1410, etc. The user device 1400 may be a mobile device in some aspects and includes an application processor 1405, baseband processor 1410 (also referred to as a baseband module), radio front end module (RFEM) 1415, memory 1420, connectivity module 1425, near field communication (NFC) controller 1430, audio driver 1435, camera driver 1440, touch screen 1445, display driver 1450, sensors 1455, removable memory 1460, power management integrated circuit (PMIC) 1465 and smart battery 1470.

In some aspects, application processor 1405 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (10), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1410 may be implemented, for example, as a solder-down substrate including one or more integrated circuits, a single packaged integrated circuit soldered to a main circuit board, and/or a multi-chip module containing two or more integrated circuits.

Figure 15:
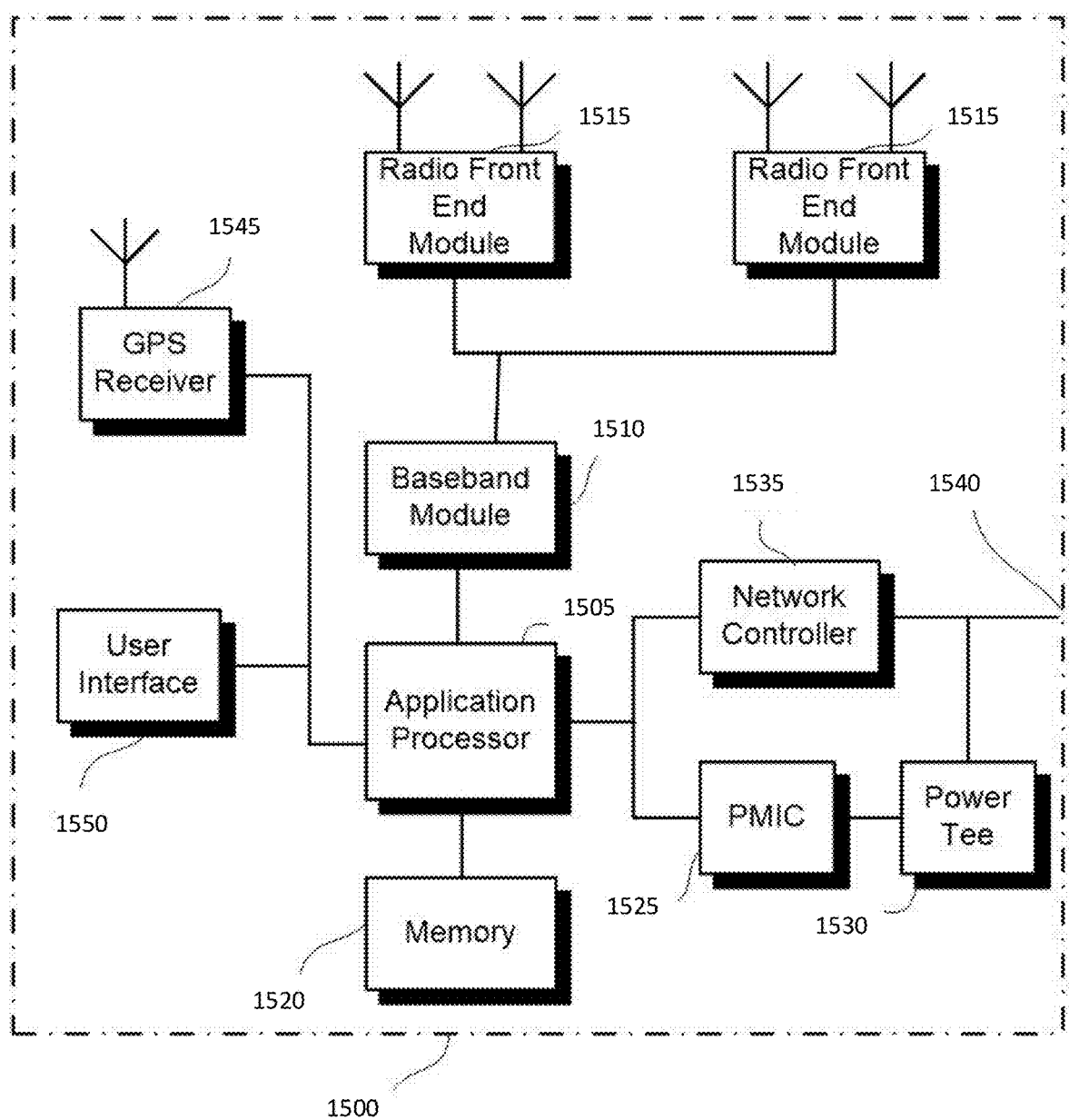
FIG. 15 illustrates a base station or infrastructure equipment radio head in which the examples disclosed herein may be implemented.

FIG. 15 illustrates a base station or infrastructure equipment radio head 1500 in which the examples disclosed herein may be implemented. For example, the examples disclosed herein may be implemented in the radio front-end module 1515, in the baseband module 1510, etc. The base station radio head 1500 may include one or more of application processor 1505, baseband modules 1510, one or more radio front end modules 1515, memory 1520, power management circuitry 1525, power tee circuitry 1530, network controller 1535, network interface connector 1540, satellite navigation receiver module 1545, and user interface 1550.

In some aspects, application processor 1505 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1510 may be implemented, for example, as a solder-down substrate including one or more integrated circuits, a single packaged integrated circuit soldered to a main circuit board or a multi-chip module containing two or more integrated circuits.

In some aspects, memory 1520 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1520 may be implemented as one or more of solder down packaged integrated circuits, socketed memory modules and plug-in memory cards.

In some aspects, power management integrated circuitry 1525 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1530 may provide for electrical power drawn from a network cable to provide both power supply and data connectivity to the base station radio head 1500 using a single cable.

In some aspects, network controller 1535 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1545 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1545 may provide data to application processor 1505 which may include one or more of position data or time data. Application processor 1505 may use time data to synchronize operations with other radio base stations.

In some aspects, user interface 1550 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows.

Example 1 is an ADC configured to convert an analog signal to digital bits comprising a plurality of sub-ADCs that are cascaded in a pipeline, a plurality of residue amplifiers, and a data synchronization circuitry. Each sub-ADC of the plurality of sub-ADCs is configured to sample an input signal that is fed to each sub-ADC and convert the sampled input signal to a pre-configured number of digital bits, and each sub-ADC of the plurality of sub-ADCs except a last sub-ADC in the pipeline is configured to generate a residue signal and feed the residue signal as an input signal to a succeeding sub-ADC in the pipeline. At least one sub-ADC among the plurality of sub-ADCs is configured to determine an MSB of the pre-configured number of digital bits while the input signal is sampled. Each residue amplifier is coupled between two sub-ADCs and configured to amplify a residue signal output from a preceding sub-ADC in the pipeline and feed the amplified residue signal to a succeeding sub-ADC in the pipeline. The data synchronization circuitry is configured to combine the digital bits output from the plurality of sub-ADCs to generate an ADC output.

Example 2 is the ADC of example 1, wherein at least one sub-ADC includes a comparator configured to determine the MSB while the input signal is sampled.

Example 3 is the ADC as in any one of examples 1-2, wherein the sub-ADCs are SAR ADCs.

Example 4 is the ADC as in any one of examples 1-3, further comprising a sampler configured to sample the analog signal, wherein the sampled analog signal is fed to a first sub-ADC in the pipeline as the input signal to the first sub-ADC. The first sub-ADC may include a comparator configured to determine the MSB.

Example 5 is the ADC of example 4, further comprising a buffer configured to buffer the sampled analog signal and feed the sampled analog signal to the first sub-ADC in the pipeline as the input signal to the first sub-ADC.

Example 6 is the ADC as in any one of examples 1-5, further comprising a first sampler configured to sample the analog signal, and a second sampler configured to sample an output signal of the first sampler, wherein the sampled output signal of the first sampler is fed to a first sub-ADC in the pipeline as the input signal to the first sub-ADC. The first sub-ADC may include a comparator configured to determine the MSB.

Example 7 is the ADC of example 6, further comprising a buffer for buffing a signal between the first sampler and the second sampler or after the second sampler.

Example 8 is the ADC of example 7, wherein the buffer has a transfer function that is either amplification, attenuation, or gain of one.

Example 9 is the ADC as in any one of examples 1-8, wherein the sub-ADCs are flash ADCs.

Example 10 is an ADC configured to convert an analog signal to digital bits, comprising a plurality of sub-ADCs that are arranged in parallel, and at least one sampler. Each of the plurality of sub-ADCs is configured to convert the analog signal to a pre-configured number of digital bits. The at least one sampler is configured to sample the analog signal and feed the sampled analog signal to the plurality of sub-ADCs, wherein the plurality of sub-ADCs are time-interleaved such that the sampled analog signal is fed to one of the plurality of sub-ADCs at a time sequentially. The at least one sub-ADC among the plurality of sub-ADCs is configured to determine an MSB of the pre-configured number of digital bits while the sampled analog signal is sampled by the at least one sub-ADC.

Example 11 is the ADC of example 10, wherein the at least one sub-ADC includes a comparator configured to determine the MSB while the input signal is sampled.

Example 12 is the ADC as in any one of examples 10-11, wherein the sub-ADCs are SAR ADCs.

Example 13 is the ADC as in any one of examples 10-12, wherein the sub-ADCs are flash ADCs.

Example 14 is the ADC as in any one of examples 10-13, wherein at least one of the sub-ADCs is a pipelined ADC.

Example 15 is a method for converting an analog signal to digital bits, comprising:

receiving an analog signal, processing the analog signal with a plurality of sub-ADCs that are pipelined, and combining digital bits output from the plurality of sub-ADCs to generate an ADC output. Each sub-ADC generates a pre-configured number of digital bits and a residue signal for a subsequent sub-ADC in a pipeline from an input signal to each sub-ADC, wherein an MSB of the pre-configured number of digital bits is determined by at least one sub-ADC among the plurality of sub-ADCs while the input signal is sampled by the at least one sub-ADC.

Example 16 is the method of example 15, wherein at least one sub-ADC includes a comparator configured to determine the MSB while the input signal is sampled.

Example 17 is the method as in any one of examples 15-16, wherein the sub-ADCs are SAR ADCs.

Example 18 is the method as in any one of examples 15-17, further comprising sampling the analog signal, wherein the sampled analog signal is fed to a first sub-ADC in the pipeline as the input signal to the first sub-ADC. The first sub-ADC includes a comparator configured to determine the MSB.

Example 19 is the method of example 18, further comprising buffering, with a buffer, the sampled analog signal and feeding the buffered sampled analog signal to the first sub-ADC in the pipeline as the input signal to the first sub-ADC.

Example 20 is the method as in any one of examples 15-19, wherein the sub-ADCs are flash ADCs.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An analog-to-digital converter (ADC) configured to convert an analog signal to digital bits, comprising:
 a plurality of sub-ADCs that are cascaded in a pipeline, wherein each sub-ADC of the plurality of sub-ADCs is configured to sample an input signal that is fed to each sub-ADC and convert the sampled input signal to a pre-configured number of digital bits, and each sub-ADC of the plurality of sub-ADCs except a last sub-ADC in the pipeline is configured to generate a residue signal and feed the residue signal as an input signal to a succeeding sub-ADC in the pipeline, wherein at least one sub-ADC among the plurality of sub-ADCs is configured to determine a most-significant bit (MSB) of the pre-configured number of digital bits to be generated by each of the at least one sub-ADC while the input signal is sampled by each of the at least one sub-ADC;

a plurality of residue amplifiers, wherein each residue amplifier is coupled between two sub-ADCs and configured to amplify a residue signal output from a preceding sub-ADC in the pipeline and feed the amplified residue signal to a succeeding sub-ADC in the pipeline; and a data synchronization circuitry configured to combine the digital bits output from the plurality of sub-ADCs to generate an ADC output.

2. The ADC of claim 1, wherein each of the at least one sub-ADC includes a comparator configured to determine the MSB while the input signal is sampled.

3. The ADC of claim 1, wherein the sub-ADCs are successive approximation register (SAR) ADCs.

4. The ADC of claim 1, further comprising:
a sampler configured to sample the analog signal, wherein the sampled analog signal is fed to a first sub-ADC in the pipeline as the input signal to the first sub-ADC,
wherein the first sub-ADC includes a comparator configured to determine the MSB.

5. The ADC of claim 4, further comprising:
a buffer configured to buffer the sampled analog signal and feed the sampled analog signal to the first sub-ADC in the pipeline as the input signal to the first sub-ADC.

6. The ADC of claim 1, further comprising:
a first sampler configured to sample the analog signal; and
a second sampler configured to sample an output signal of the first sampler, wherein the sampled output signal of the first sampler is fed to a first sub-ADC in the pipeline as the input signal to the first sub-ADC,
wherein the first sub-ADC includes a comparator configured to determine the MSB.

7. The ADC of claim 6, further comprising:
a buffer for buffing a signal between the first sampler and the second sampler or after the second sampler.

8. The ADC of claim 7, wherein the buffer has a transfer function that is either amplification, attenuation, or gain of one.

9. The ADC of claim 1, wherein the sub-ADCs are flash ADCs.

10. An analog-to-digital converter (ADC) configured to convert an analog signal to digital bits, comprising:
a plurality of sub-ADCs that are arranged in parallel, wherein each of the plurality of sub-ADCs is configured to convert the analog signal to a pre-configured number of digital bits; and
at least one sampler configured to sample the analog signal and feed the sampled analog signal to the plurality of sub-ADCs, wherein the plurality of sub-ADCs are time-interleaved such that the sampled analog signal is fed to one of the plurality of sub-ADCs at a time sequentially,
wherein at least one sub-ADC among the plurality of sub-ADCs is configured to determine a most-significant bit (MSB) of the pre-configured number of digital bits to be generated by each of the at least one sub-ADC while the sampled analog signal is sampled by each of the at least one sub-ADC.

11. The ADC of claim 10, wherein each of the at least one sub-ADC includes a comparator configured to determine the MSB while the input signal is sampled.

12. The ADC of claim 10, wherein the sub-ADCs are successive approximation register (SAR) ADCs.

13. The ADC of claim 10, wherein the sub-ADCs are flash ADCs.

14. The ADC of claim 10, wherein at least one of the sub-ADCs is a pipelined ADC.

15. A method for converting an analog signal to digital bits, comprising:
receiving an analog signal;
processing the analog signal with a plurality of sub-analog-to-digital converters (ADCs) that are pipelined, wherein each sub-ADC generates a pre-configured number of digital bits and a residue signal for a subsequent sub-ADC in a pipeline from an input signal to each sub-ADC, wherein a most-significant bit (MSB) of the pre-configured number of digital bits to be generated by each of at least one sub-ADC among the plurality of sub-ADCs is determined by each of the at least one sub-ADC while the input signal to each of the at least one sub-ADC is sampled by each of the at least one sub-ADC; and
combining digital bits output from the plurality of sub-ADCs to generate an ADC output.

16. The method of claim 15, wherein each of the at least one sub-ADC includes a comparator configured to determine the MSB while the input signal is sampled.

17. The method of claim 15, wherein the sub-ADCs are successive approximation register (SAR) ADCs.

18. The method of claim 15, further comprising:
sampling the analog signal, wherein the sampled analog signal is fed to a first sub-ADC in the pipeline as the input signal to the first sub-ADC,
wherein the first sub-ADC includes a comparator configured to determine the MSB.

19. The method of claim 18, further comprising:
buffering, with a buffer, the sampled analog signal; and
feeding the buffered sampled analog signal to the first sub-ADC in the pipeline as the input signal to the first sub-ADC.

20. The method of claim 15, wherein the sub-ADCs are flash ADCs.

* * * * *